(12) United States Patent
Pappu et al.

(10) Patent No.: US 10,319,453 B2
(45) Date of Patent: Jun. 11, 2019

(54) BOARD LEVEL LEAKAGE TESTING FOR MEMORY INTERFACE

(71) Applicant: Intel Corporation, Santa Clara, CA (US)

(72) Inventors: Lakshminarayana Pappu, Folsom, CA (US); James J. Grealish, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 15/461,375

(22) Filed: Mar. 16, 2017

(65) Prior Publication Data
US 2018/0268915 A1 Sep. 20, 2018

(51) Int. Cl.
| | |
|---|---|
| *G11C 29/00* | (2006.01) |
| *G11C 29/08* | (2006.01) |
| *G06F 11/25* | (2006.01) |
| *G11C 29/50* | (2006.01) |

(52) U.S. Cl.
CPC ............ *G11C 29/08* (2013.01); *G06F 11/25* (2013.01); *G11C 29/50004* (2013.01)

(58) Field of Classification Search
CPC . G11C 29/08; G11C 29/50004; G11C 29/025; G11C 29/12005; G11C 16/00; G11C 2029/5006; G11C 11/15; G11C 29/56; G11C 29/56004; G11C 2029/5606; G06F 11/25; G01R 31/31928
See application file for complete search history.

(56) References Cited

U.S. PATENT DOCUMENTS

| | | | |
|---|---|---|---|
| 6,282,680 B1 * | 8/2001 | Takagi ............... | G01R 31/3016 714/724 |
| 9,635,296 B2 * | 4/2017 | Yui ...................... | H04N 5/3575 |
| 2004/0130344 A1 * | 7/2004 | Rohrbaugh ....... | G01R 31/31715 324/762.02 |
| 2006/0092755 A1 * | 5/2006 | Sato .................. | G01R 31/31928 365/233.5 |
| 2011/0122670 A1 * | 5/2011 | Yamazaki .......... | G11C 16/0433 365/72 |
| 2015/0346274 A1 * | 12/2015 | Gorman ............. | G01R 31/2856 324/762.03 |
| 2016/0018453 A1 * | 1/2016 | Jeon ..................... | G01R 31/025 324/551 |
| 2016/0018454 A1 * | 1/2016 | Jeon ..................... | G11C 29/025 324/509 |

* cited by examiner

*Primary Examiner* — Guerrier Merant
(74) *Attorney, Agent, or Firm* — Schwabe, Williamson & Wyatt, P.C.

(57) ABSTRACT

Embodiments are generally directed to board level leakage testing for a memory interface. An embodiment of an apparatus includes multiple logic cells for testing of a memory interface, each logic cell being connected to an interconnect for a respective memory element. Each logic cell includes a driver to drive a signal onto the interconnect with the respective memory element, an element to generate a value for the logic cell by comparing a signal with a reference voltage, a flip-flop to capture a cell value for the logic cell, and a drive control element to control the value driven on the interconnect by the driver. The apparatus further includes a processor to identify failure conditions based at least in part on testing using the logic cells.

22 Claims, 5 Drawing Sheets

| Cell N | Neighboring Cells (N-1), (N+1) | Data Read From Cell N | Data Read From Cells (N-1), (N+1) | Diagnosis |
|---|---|---|---|---|
| 1 | Z | 1 | X | PASS |
| 1 | Z | 0 | X | Open on the Board |
| 0 | Z | 0 | X | PASS |
| 0 | Z | 1 | X | Short to Vcc on the Board to Cell N, Likely from the DRAM Side |
| 1 | Z | X | 1 | Short Between Cell N and the Neighboring Cells |

Where:
Z = High Impedance State
X = Don't Care State

FIG. 4

BOARD LEVEL LEAKAGE TESTING FOR MEMORY INTERFACE

TECHNICAL FIELD

Embodiments described herein generally relate to the field of electronic devices and, more particularly, board level leakage testing for a memory interface.

BACKGROUND

For effective platform level testing of computer system, one of the elements to be addressed is the testing of memory devices. The continuing increase in speeds of operation in computer platforms of devices has resulted in certain complications such that conventional testing of memory may no longer provide adequate results.

Because cost considerations for test implementation, including the cost of including additional TAP pins for testing, DRAM (Dynamic Random Access Memory) logic commonly does not incorporate typical board testing logic. In lieu of such test access, original equipment manufacturers (OEMs) implement testing processes that include sending functional traffic to memory devices at low speeds, and relying upon the board testing apparatus from the CPU (central processing unit) to provide for testing operation.

However, with the increasing DDR (Double Data Rate) speeds and varying vendor proprietary logic implementations, certain DRAM devices do not respond reliably to this conventional means of testing at low speeds, and thus require other means for providing board testing of memory.

BRIEF DESCRIPTION OF THE DRAWINGS

Embodiments described here are illustrated by way of example, and not by way of limitation, in the figures of the accompanying drawings in which like reference numerals refer to similar elements.

FIG. 4 is a chart for detection of faults based on data collected in a static leakage test for platform testing according to an embodiment.

DETAILED DESCRIPTION

Embodiments described herein are generally directed to board level leakage testing for a memory interface.

In the reset of a computing platform for purposes of platform testing, the reset operation generally results in shutdown of IO(Input Output) elements. In the implementation of board testing, the system reset can't be completed. Because of this, the DDR memory training conventionally doesn't occur. This process prevents the testing of the memory logic in a functional manner.

Conventional industry processes have implemented testing of memory using slower clock speeds, which and can in some implementations provide reasonable testing results using relatively lower DDR speeds. However, this conventional method is not scalable to higher speeds, and results in unreliable testing operation with certain DRAM memories that operate at high speeds, such as speeds in the range to 20 Gbits/sec. (gigabits per second).

In some embodiments, an apparatus, system, or process provides for board level leakage testing for a memory interface using a static leakage testing structure and process, thus enabling testing for memory including high-speed memory that does not respond reliably to conventional low speed operational testing.

Figure 1:
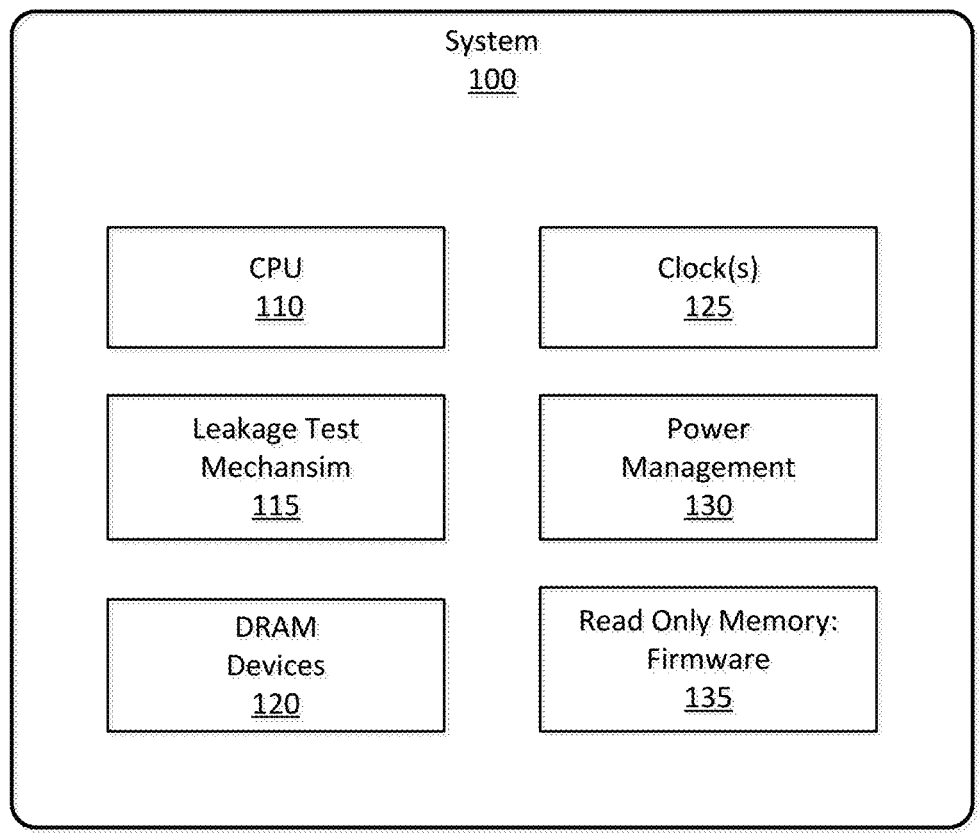
FIG. 1 illustrates a system including a mechanism or logic for board level leakage testing of DRAM memory in a computer platform according to an embodiment.

FIG. 1 illustrates a system including a mechanism or logic for board level leakage testing of DRAM memory in a computer platform according to an embodiment. As illustrated in FIG. 1, a computer platform 100 includes a CPU or other processor 110 together memory including one or more DRAM devices 120 for storing data for processing. The computer platform may further include one or more clocks 125, which may operate at high speeds such as speeds near 20 gigabits per second; a power management unit that may control, for example, the shutdown of platform elements when possible; and read-only memory (or other non-volatile memory) for the storage of firmware 135 that includes, for example, instructions for handling of reset conditions for the computer platform 100.

Figure 3:
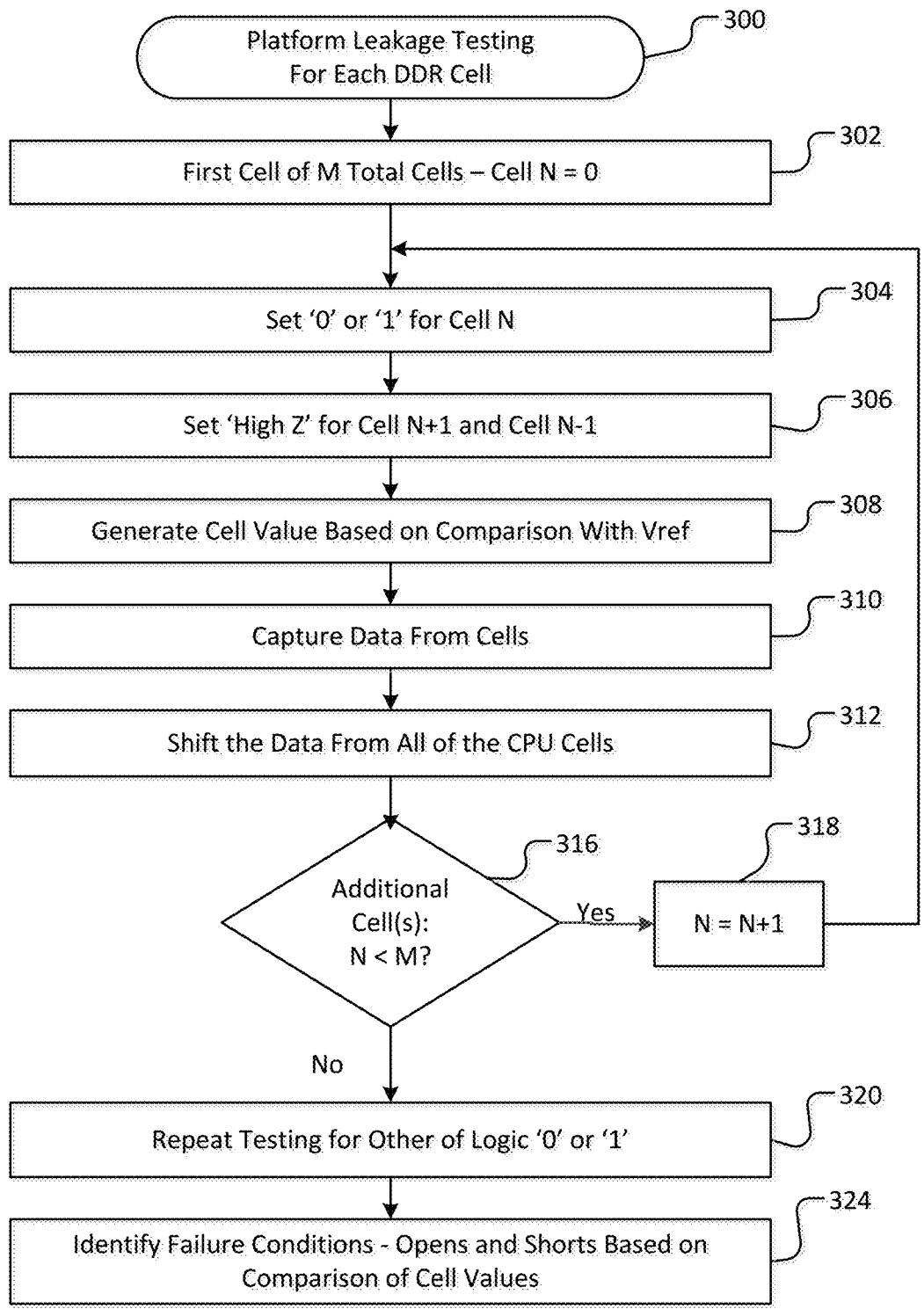
FIG. 3 illustrates a process for board level leakage testing for a memory interface.

In some embodiments, the computer platform 100 further includes a leakage test mechanism 115 for the testing of leakage for the DRAM memory devices 120 of the platform, wherein the leakage test mechanism provides static testing, such as illustrated in FIGS. 3 and 4.

Figure 2:
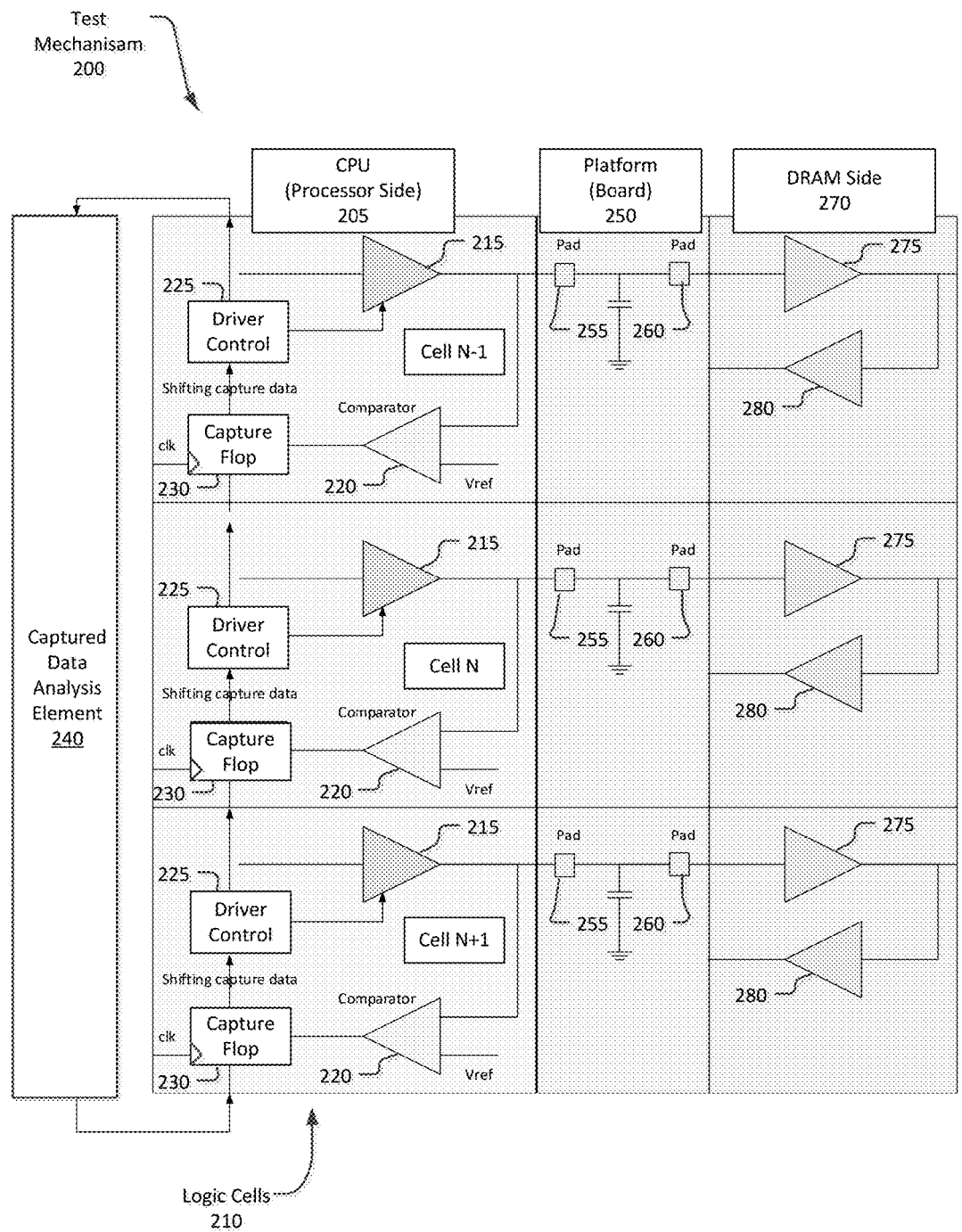
FIG. 2 illustrates elements of a mechanism or logic for board level leakage testing of DRAM memory in a computer platform according to an embodiment.

FIG. 2 illustrates elements of a mechanism or logic for board level leakage testing of DRAM memory in a computer platform according to an embodiment. As illustrated in FIG. 2, the test mechanism 200 for the platform includes elements of the CPU (processor) side 205, the platform (the board under test) 250, and the DRAM (memory) side 270. The processor side 205 includes a set of multiple logic cells 210 (which may be referred to as a scan chain), wherein three cells of the plurality of cells 210 are illustrated in FIG. 2, the illustrated cells being Cell N−1, Cell N, and Cell N+1. As used herein, Cell N−1 and N+1 are neighboring cells to Cell N, such as Cell N−1 being a prior (preceding) logic cell and Cell N+1 being a following (succeeding) cell. However, testing is not limited to such immediate neighbor cells, and may include any or all of the set of cells.

Each cell of the set of logic cells 210 is connected to a pad 255 on the platform 250, which provides an interconnect to a pad 260 for a connection to a memory element on the DRAM side 270. Also illustrated is the capacitance of the platform interconnect, which represents the capacitance of the traces or other interconnection elements.

In some embodiments, each memory element of the DRAM side includes a first driver 275 for driving a signal received from the CPU and a second driver 280 for driving a signal from the DRAM memory element to the CPU, wherein a connection between the first driver 275 and the second driver 280 allows for testing of the interconnect for the memory.

Each cell of the scan chain 210 of the CPU side includes a driver 215 to drive signals to the memory interconnect for the respective memory element; a comparator 220 to compare a signal from the memory interconnect with a reference voltage (Vref); a capture flip-flop 230 to capture a signal from the comparator 220 and to shift captured data between the cells in the set of cells; and a driver control 225 to drive the driver 215 to a tristate value.

The test data shifted into the cells of the plurality of logic cells 210 is provided by a captured data analysis element 240. Further, the data from the cells of the scan chain 210 shifted through the cells to the captured data analysis element 240 to identify error conditions from the captured test data.

In some embodiments, the test mechanism 200 provides for static testing, such as illustrated in FIGS. 3 and 4.

FIG. 3 illustrates a process for board level leakage testing for a memory interface. In some embodiments, the process may be implemented utilizing the mechanism illustrated in FIG. 2.

In some embodiments, a process for platform leakage testing of each DDR cell in a computer platform 300 includes the following:

302: Set N at first CPU logic cell of scan chain, such as N=0. In this example, there are M total cells.

304: Set the bit value for cell N to be either logic '0' or logic '1'. A shift register chain in the scan chain shifts the appropriate data to the driving cells.

306: Set the bit value for the other cells, such as neighboring cells cell N−1 and N+1, to be high impedance value, 'High Z'.

308: Generate a cell value for each cell such as by comparing a signal with a reference voltage.

310: Capture values for one or more logic cells.

312: Shift the values through the shift chain.

316: Determine whether there are any additional cells to tested, such as by determining if N<M.

318: If there are one or more additional cells to be testing, increment to the next cell (N=N+1), and return to setting the bit value for cell N to be either logic '0' or logic '1', element 304.

320: Repeat the testing of each cell for the other of logic '0' or logic '1'. (Alternatively each of the cells may be tested first by setting the cell to one of either logic '0' or logic '1', and then by setting the sell to the other of logic '0' or logic '1'.)

324: If all cells have been tested, then failure conditions, the failure conditions including any opens and shorts in the interface, may be identified based on the values obtained for cell in the testing process. The test results identification may be pursuant to the chart provided in FIG. 4. However, fault conditions to be tested and identified are not limited the faults listed in FIG. 4.

FIG. 4 is a chart for detection of faults based on data collected in a static leakage test for platform testing according to an embodiment. As the table is shown in FIG. 4, there are columns for the value driven on a particular cell N; the value driven on each of the remaining cells, including neighboring cells N−1 and N+1; the data value that is read from cell N; the value that is read from the neighboring cells N−1 and N+1; and the diagnosis or conclusion to be reached based on the values for the cells.

As provided in FIG. 4:

If '1' is driven on cell N and Z is driven on N−1 and N+1, and the value read from Cell N is '1' while the value read from N−1 and N+1 is any value (Don't Care X), the diagnosis is that the cell Passes.

If '1' is driven on cell N and Z is driven on N−1 and N+1, and the value read from Cell N is '0' while the value read from N−1 and N+1 is any value, the diagnosis is that there is an Open on the board.

If '0' is driven on cell N and Z is driven on N−1 and N+1, and the value read from Cell N is '0' while the value read from N−1 and N+1 is any value (Don't Care X), the diagnosis is that the cell Passes.

If '0' is driven on cell N and Z is driven on N−1 and N+1, and the value read from Cell N is '1' while the value read from N−1 and N+1 is any value (Don't Care X), the diagnosis is that there is a short to the Vcc voltage at Cell N, wherein the short is likely from the DRAM side.

If '1' is driven on cell N and Z is driven on N−1 and N+1, and the value read from N−1 or N+1 is '1' while the value read from Cell N is any value (Don't Care X), the diagnosis is that there is a short between Cell N and one or more neighboring cell.

Figure 5:
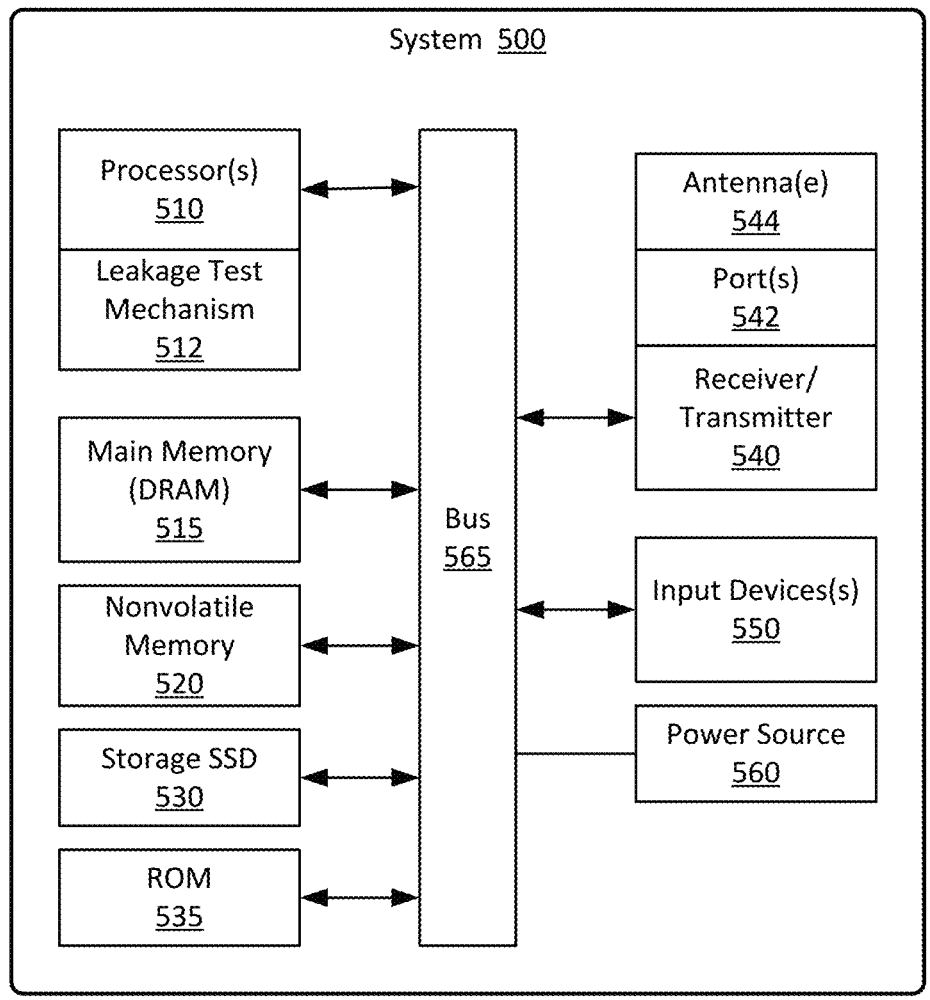
FIG. 5 is an illustration of a system including a mechanism for leakage testing for a memory interface according to an embodiment.

FIG. 5 is an illustration of a system including a mechanism for leakage testing for a memory interface according to an embodiment. In this illustration, certain standard and well-known components that are not germane to the present description are not shown. The system 500 may include, for example, an SoC (System on Chip) combining multiple elements on a single chip.

In some embodiments, the system 500 may include a processing means such as one or more processors 510 coupled to one or more buses or interconnects, shown in general as bus 565. The processors 510 may comprise one or more physical processors and one or more logical processors. In some embodiments, the processors may include one or more general-purpose processors or special-purpose processors.

The bus 565 is a communication means for transmission of data. The bus 565 is illustrated as a single bus for simplicity, but may represent multiple different interconnects or buses and the component connections to such interconnects or buses may vary. The bus 565 shown in FIG. 5 is an abstraction that represents any one or more separate physical buses, point-to-point connections, or both connected by appropriate bridges, adapters, or controllers.

In some embodiments, the system 500 further comprises a random access memory (RAM) or other dynamic storage device or element as a main memory 515 for storing information and instructions to be executed by the processors 510. Main memory 515 may include, but is not limited to, dynamic random access memory (DRAM).

In some embodiments, the system 500 further includes a leakage test mechanism 512, such as illustrated in FIG. 2, for the testing of interconnects with the DRAM memory 515.

The system 500 also may comprise a non-volatile memory 520; a storage device such as a solid state drive (SSD) 530; and a read only memory (ROM) 535 or other static storage device for storing static information and instructions for the processors 510.

In some embodiments, the system 500 includes one or more transmitters or receivers 540 coupled to the bus 565. In some embodiments, the system 500 may include one or more antennae 544, such as dipole or monopole antennae, for the transmission and reception of data via wireless communication using a wireless transmitter, receiver, or both, and one or more ports 542 for the transmission and reception of data via wired communications. Wireless communication includes, but is not limited to, Wi-Fi, Bluetooth™, near field communication, and other wireless communication standards.

In some embodiments, system 500 includes one or more input devices 550 for the input of data, including hard and soft buttons, a joy stick, a mouse or other pointing device, a keyboard, voice command system, or gesture recognition system.

In some embodiments, system 500 includes an output display 555, where the output display 555 may include a liquid crystal display (LCD) or any other display technology, for displaying information or content to a user. In some environments, the output display 555 may include a touchscreen that is also utilized as at least a part of an input device 550. Output display 555 may further include audio output, including one or more speakers, audio output jacks, or other audio, and other output to the user.

The system 500 may also comprise a battery or other power source 560, which may include a solar cell, a fuel cell, a charged capacitor, near field inductive coupling, or other system or device for providing or generating power in the system 500. The power provided by the power source 560 may be distributed as required to elements of the system 500.

An apparatus includes a plurality of logic cells for testing of a memory interface, each logic cell of the plurality of logic cells being connected to an interconnect for a respective memory element, wherein each logic cell of the plurality of logic cells includes: a driver to drive a signal onto the interconnect with the respective memory element, an element to generate a value for the logic cell by comparing a signal with a reference voltage, a flip-flop to capture a cell value for the logic cell, and a drive control element to control the value driven on the interconnect by the driver; and a processor to identify failure conditions based at least in part on testing using the plurality of logic cells.

In some embodiments, the driver of a first logic cell is to drive a logic '0' or '1' on the first logic cell, and the driver of each for one or more other logic cells is to drive a high impedance state on the one or more other logic cells.

In some embodiments, for a logic '1' driven on the first logic cell, the processor is to identify a passing test result upon detecting a logic '1' on the first logic cell.

In some embodiments, for a logic '1' driven on the first logic cell, the processor is to identify an open on the board upon detecting a logic '0' on the first logic cell.

In some embodiments, for a logic '0' driven on the first logic cell, the processor is to identify a passing test result upon detecting a logic '0' on the first logic cell.

In some embodiments, for a logic '0' driven on the first logic cell, the processor is to identify a short to a voltage source on the board upon detecting a logic '1' on the first logic cell.

In some embodiments, for a logic '1' driven on the first logic cell, the processor is to identify a short between the first logic cell and one or more other logic cells on the board upon detecting a logic '1' on any of the one or more other logic cells.

In some embodiments, a non-transitory computer-readable storage medium having stored thereon data representing sequences of instructions that, when executed by a processor, cause the processor to perform operations including performing a test sequence for each logic cell of a plurality of logic cells for a memory interface, the test sequence including the following: setting a logical value of '1' or '0' for the logic cell, setting a high impedance for one or more other logic cells of the plurality of logic cells, generating a cell value of each logic cell of the plurality of logic cells based on a comparison of a signal value with a reference voltage, capturing the cell value, and shifting the cell value to a next logic cell; and identifying any shorted connections or open connections for the memory interface based at least in part on results of the test sequence for each of the plurality of logic cells.

In some embodiments, the medium further includes instructions for repeating the test sequence including setting a logic value of the other of logic '0' or '1'.

In some embodiments, identifying any shorted connections or open connections for the memory interface includes, for a logic '1' driven on the logic cell, identifying a passing test result upon detecting a logic '1' on the logic cell.

In some embodiments, identifying any shorted connections or open connections for the memory interface includes, for a logic '1' driven on the logic cell, identifying an open on the board upon detecting a logic '0' on the logic cell.

In some embodiments, identifying any shorted connections or open connections for the memory interface includes, for a logic '0' driven on the logic cell, identifying a passing test result upon detecting a logic '0' on the logic cell.

In some embodiments, identifying any shorted connections or open connections for the memory interface includes, for a logic '0' driven on the logic cell, identifying a short to a voltage source on the board upon detecting a logic '1' on the logic cell.

In some embodiments, identifying any shorted connections or open connections for the memory interface includes, for a logic '1' driven on the logic cell, identifying a short between the logic cell and one or more other logic cells on the board upon detecting a logic '1' on any of the one or more other logic cells.

In some embodiments, an apparatus includes means for performing a test sequence for each logic cell of a plurality of logic cells for a memory interface, the test sequence including the following: setting a logical value of '1' or '0' for the logic cell, setting a high impedance for one or more other logic cells of the plurality of logic cells, generating a cell value of each logic cell of the plurality of logic cells based on a comparison of a signal value with a reference voltage, capturing the cell value, and shifting the cell value to a next logic cell; and means for identifying any shorted connections or open connections for the memory interface based at least in part on results of the test sequence for each of the plurality of logic cells.

In some embodiments, the apparatus further includes means for repeating the test sequence including setting a logic value of the other of logic '0' or '1'.

In some embodiments, identifying any shorted connections or open connections for the memory interface includes, for a logic '1' driven on the logic cell, identifying a passing test result upon detecting a logic '1' on the logic cell.

In some embodiments, identifying any shorted connections or open connections for the memory interface includes, for a logic '1' driven on the logic cell, identifying an open on the board upon detecting a logic '0' on the logic cell.

In some embodiments, identifying any shorted connections or open connections for the memory interface includes, for a logic '0' driven on the logic cell, identifying a passing test result upon detecting a logic '0' on the logic cell.

In some embodiments, identifying any shorted connections or open connections for the memory interface includes, for a logic '0' driven on the logic cell, identifying a short to a voltage source on the board upon detecting a logic '1' on the logic cell.

In some embodiments, identifying any shorted connections or open connections for the memory interface includes, for a logic '1' driven on the logic cell, identifying a short between the logic cell and one or more other logic cells on the board upon detecting a logic '1' on any of the one or more other logic cells.

In some embodiments, a system includes a processor for processing of data; a memory for storage of data; a memory interface for the memory; and a plurality of logic cells for testing of the memory interface, each logic cell of the plurality of logic cells being connected to an interconnect for a respective memory element, wherein each logic cell of the plurality of logic cells includes a driver to drive a signal onto the interconnect with the respective memory element, an element to generate a value for the logic cell by comparing a signal with a reference voltage, a flip-flop to capture a cell value for the logic cell, and a drive control element to control the value driven on the interconnect by the driver. In some embodiments, the processor is to identify failure conditions based at least in part on testing using the plurality of logic cells.

In some embodiments, the driver of a first logic cell is to drive a logic '0' or '1' on the first logic cell, and the driver of each for one or more other logic cells is to drive a high impedance state on the one or more other logic cells.

In some embodiments, for a logic '1' driven on the first logic cell, the processor is to identify a passing test result upon detecting a logic '1' on the first logic cell.

In some embodiments, for a logic '1' driven on the first logic cell, the processor is to identify an open on the board upon detecting a logic '0' on the first logic cell.

In some embodiments, for a logic '0' driven on the first logic cell, the processor is to identify a passing test result upon detecting a logic '0' on the first logic cell.

In some embodiments, for a logic '0' driven on the first logic cell, the processor is to identify a short to a voltage source on the board upon detecting a logic '1' on the first logic cell.

In some embodiments, for a logic '1' driven on the first logic cell, the processor is to identify a short between the first logic cell and one or more other logic cells on the board upon detecting a logic '1' on any of the one or more other logic cells.

In some embodiments, the system further includes a transmitter or receiver for transmission or reception of data, and a dipole antenna for the transmission or reception of data.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. An apparatus comprising:
   a plurality of logic cells for testing of a memory interface, each logic cell of the plurality of logic cells being connected to an interconnect for a respective memory element, wherein each logic cell of the plurality of logic cells includes:
   a driver to drive a signal onto the interconnect with the respective memory element,
   an element to generate a value for the logic cell by comparing a signal with a reference voltage,
   a flip-flop to capture a cell value for the logic cell, and
   a drive control element to control the value driven on the interconnect by the driver; and a processor to identify failure conditions based at least in part on testing using the plurality of logic cells.

2. The apparatus of claim 1, wherein the driver of a first logic cell is to drive a logic '0' or '1' on the first logic cell, and the driver of each for one or more other logic cells is to drive a high impedance state on the one or more other logic cells.

3. The apparatus of claim 2, wherein, for a logic '1' driven on the first logic cell, the processor is to identify a passing test result upon detecting a logic '1' on the first logic cell.

4. The apparatus of claim 2, wherein, for a logic '1' driven on the first logic cell, the processor is to identify an open on the board upon detecting a logic '0' on the first logic cell.

5. The apparatus of claim 2, wherein for a logic '0' driven on the first logic cell, the processor is to identify a passing test result upon detecting a logic '0' on the first logic cell.

6. The apparatus of claim 2, wherein, for a logic '0' driven on the first logic cell, the processor is to identify a short to a voltage source on the board upon detecting a logic '1' on the first logic cell.

7. The apparatus of claim 2, wherein, for a logic '1' driven on the first logic cell, the processor is to identify a short between the first logic cell and one or more other logic cells on the board upon detecting a logic '1' on any of the one or more other logic cells.

8. A non-transitory computer-readable storage medium having stored thereon data representing sequences of instructions that, when executed by a processor, cause the processor to perform operations comprising: performing a test sequence for each logic cell of a plurality of logic cells for a memory interface, the test sequence including the following:

setting a logical value of '1' or '0' for the logic cell,
setting a high impedance for one or more other logic cells of the plurality of logic cells,
generating a cell value of each logic cell of the plurality of logic cells based on a comparison of a signal value with a reference voltage,
capturing the cell value, and
shifting the cell value to a next logic cell; and
identifying any shorted connections or open connections for the memory interface based at least in part on results of the test sequence for each of the plurality of logic cells.

9. The medium of claim 8, further comprising instructions that, when executed by the processor, cause the processor to perform operations comprising:
repeating the test sequence including setting a logic value of the other of logic '0' or '1'.

10. The medium of claim 8, wherein identifying any shorted connections or open connections for the memory interface includes, for a logic '1' driven on the logic cell, identifying a passing test result upon detecting a logic '1' on the logic cell.

11. The medium of claim 8, wherein identifying any shorted connections or open connections for the memory interface includes, for a logic '1' driven on the logic cell, identifying an open on the board upon detecting a logic '0' on the logic cell.

12. The medium of claim 8, wherein identifying any shorted connections or open connections for the memory interface includes, for a logic '0' driven on the logic cell, identifying a passing test result upon detecting a logic '0' on the logic cell.

13. The medium of claim 8, wherein identifying any shorted connections or open connections for the memory interface includes, for a logic '0' driven on the logic cell, identifying a short to a voltage source on the board upon detecting a logic '1' on the logic cell.

14. The medium of claim 8, wherein identifying any shorted connections or open connections for the memory interface includes, for a logic '1' driven on the logic cell, identifying a short between the logic cell and one or more other logic cells on the board upon detecting a logic '1' on any of the one or more other logic cells.

15. A system comprising:
a processor for processing of data;
a memory for storage of data; a memory interface for the memory; and
a plurality of logic cells for testing of the memory interface, each logic cell of the plurality of logic cells being connected to an interconnect for a respective memory element, wherein each logic cell of the plurality of logic cells includes:
a driver to drive a signal onto the interconnect with the respective memory element,
an element to generate a value for the logic cell by comparing a signal with a reference voltage,
a flip-flop to capture a cell value for the logic cell, and
a drive control element to control the value driven on the interconnect by the driver;
wherein the processor is to identify failure conditions based at least in part on testing using the plurality of logic cells.

16. The system of claim 15, wherein the driver of a first logic cell is to drive a logic '0' or '1' on the first logic cell, and the driver of each for one or more other logic cells is to drive a high impedance state on the one or more other logic cells.

17. The system of claim 16, wherein, for a logic '1' driven on the first logic cell, the processor is to identify a passing test result upon detecting a logic '1' on the first logic cell.

18. The system of claim 17, wherein, for a logic '1' driven on the first logic cell, the processor is to identify an open on the board upon detecting a logic '0' on the first logic cell.

19. The system of claim 17, wherein, for a logic '0' driven on the first logic cell, the processor is to identify a passing test result upon detecting a logic '0' on the first logic cell.

20. The system of claim 17, wherein, for a logic '0' driven on the first logic cell, the processor is to identify a short to a voltage source on the board upon detecting a logic '1' on the first logic cell.

21. The system of claim 17, wherein, for a logic '1' driven on the first logic cell, the processor is to identify a short between the first logic cell and one or more other logic cells on the board upon detecting a logic '1' on any of the one or more other logic cells.

22. The system of claim 15, further comprising a transmitter or receiver for transmission or reception of data, and a dipole antenna for the transmission or reception of data.

* * * * *